(12) United States Patent
Bacchin et al.

(10) Patent No.: US 11,695,419 B2
(45) Date of Patent: Jul. 4, 2023

(54) ELECTRICAL SWITCH

(71) Applicant: Iotty Srl, Porcia (IT)

(72) Inventors: Alberto Bacchin, Porcia (IT); Edoardo Cesari, Porcia (IT)

( * ) Notice: Subject to any disclaimer, the term of this patent is extended or adjusted under 35 U.S.C. 154(b) by 0 days.

(21) Appl. No.: 17/367,567

(22) Filed: Jul. 5, 2021

(65) Prior Publication Data

US 2022/0247408 A1 Aug. 4, 2022

(30) Foreign Application Priority Data

Feb. 4, 2021 (IT) .......................... 102021000002492

(51) Int. Cl.
| | |
|---|---|
| *H03K 17/975* | (2006.01) |
| *H01H 13/02* | (2006.01) |
| *H03K 17/96* | (2006.01) |
| *H01H 9/02* | (2006.01) |

(52) U.S. Cl.
CPC ......... *H03K 17/962* (2013.01); *H01H 9/0235* (2013.01)

(58) Field of Classification Search
CPC ........ H01H 11/00; H01H 13/02; H01H 19/14; H01H 23/04; H01H 47/00; H05B 37/02; H05B 33/08; G06K 9/00; H04R 1/02; H04R 27/00; H04R 29/00; G06F 3/16; G06F 3/041; G06F 3/038; H01R 27/02; H01R 13/70; H01R 13/74; H01R 25/00; H05K 5/00; H05K 5/02; H04N 7/18; H04N 5/225; G09F 9/30; G09F 9/302; H02G 3/08; H02G 3/12; H02G 3/16; H02G 3/18; F21V 8/00

See application file for complete search history.

(56) References Cited

U.S. PATENT DOCUMENTS

| | | | |
|---|---|---|---|
| 10,958,026 B1* | 3/2021 | King | G01J 5/0205 |
| 2013/0123991 A1* | 5/2013 | Richmond | F24F 11/30 |
| | | | 700/276 |
| 2016/0339134 A1* | 11/2016 | Murahari | B05B 12/08 |
| 2017/0273203 A1* | 9/2017 | Laconis | H02G 3/18 |
| 2018/0182387 A1* | 6/2018 | Chua | H04R 1/406 |
| 2019/0042000 A1* | 2/2019 | Kasmieh | G06F 1/1684 |

* cited by examiner

*Primary Examiner* — Chanh D Nguyen
*Assistant Examiner* — Nguyen H Truong
(74) *Attorney, Agent, or Firm* — Themis Law

(57) ABSTRACT

A switch device includes a main module, which includes at least one main electronic control circuit, connections to the electrical system of a building and/or to equipment or devices to be controlled, one or more touch sensors or contacts connected to the at least one main electronic control circuit, a main box-shaped housing element for the preceding components, and one or more systems that provide a reversible electric or electronic and mechanical connection of the main module to an accessory module.

6 Claims, 1 Drawing Sheet

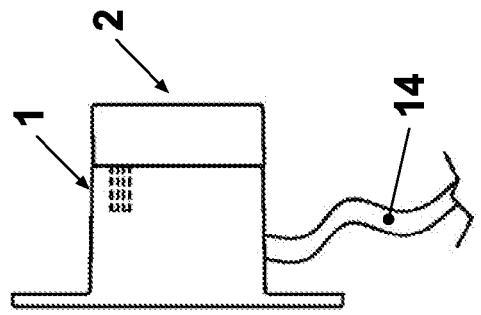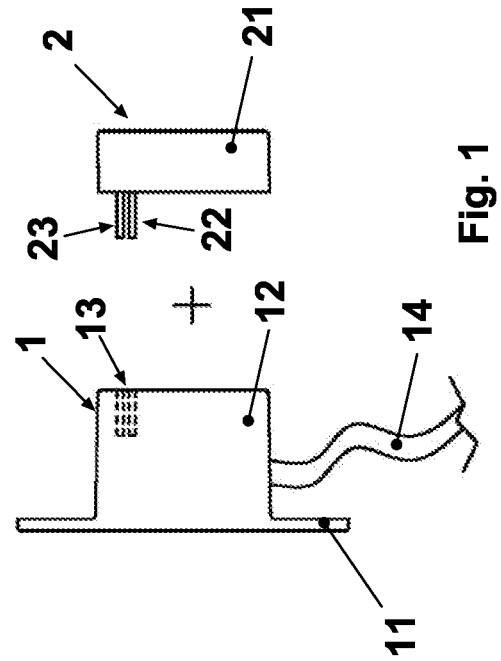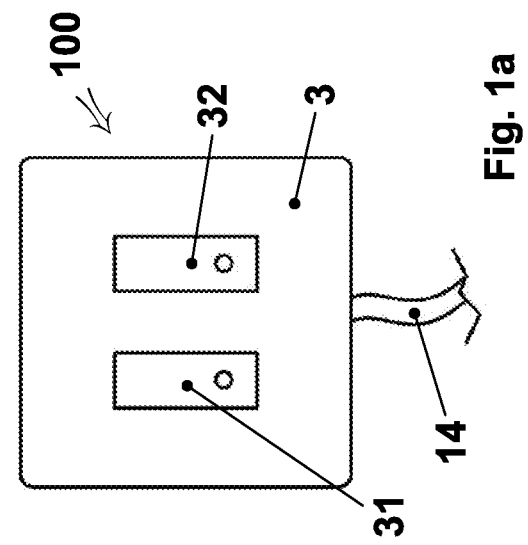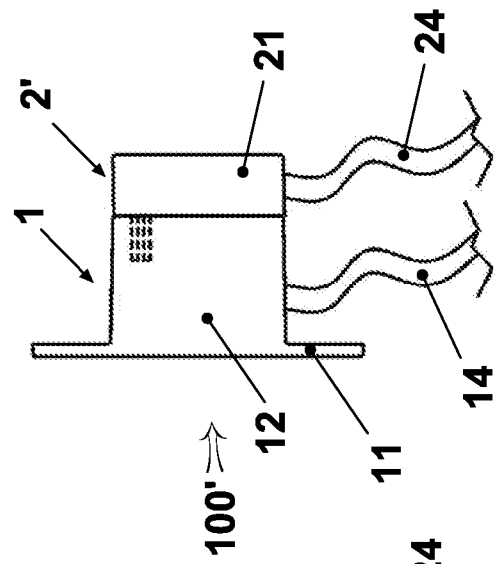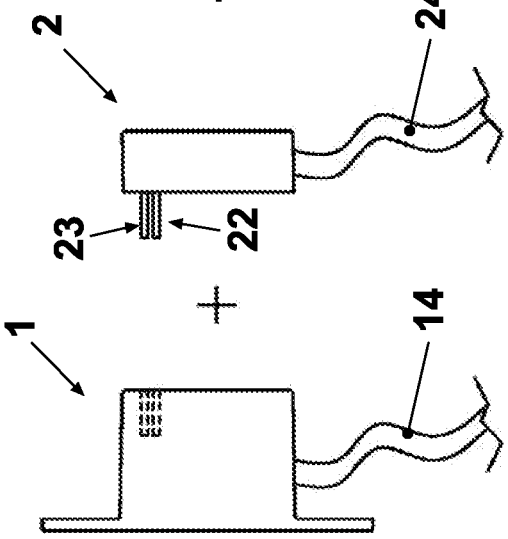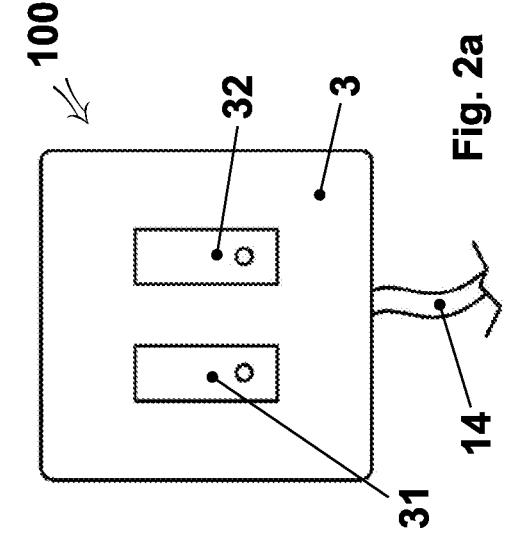

ELECTRICAL SWITCH

FIELD OF THE INVENTION

The present invention relates to switch devices, present in all types of buildings, for both civil and industrial use, for switching on/off indoor or outdoor lights, for electrical sockets, for thermostats, for the opening/closing of doors, gates, curtains and shutters or for other electrical equipment for civil or industrial use.

BACKGROUND OF THE INVENTION

The prior art includes various types of electro-mechanical switch devices, and more recently they are also equipped with various types of sensors, such as touch screen sensors, which enable the switching on and off of lights or electrical/electronic equipment in general, as well as the opening and closing of doors, gates, curtains, shutters and other devices.

Said switch devices equipped with suitable sensors may have a single switch on one plate or may be placed in groups of two or three or more on a single plate and may include backlighting systems in order to help the user to identify the switch to be used.

Said switch devices are commonly installed on a plate supporting the switch modules and coupling for the external plate.

Each plate will support a certain number of switches, for example three, where each of said switches will be able to open and close a circuit relating to a specific lighting body or specific electrical equipment.

Capacitive touch-controlled on/off devices are known in the prior art and comprise an external plate on which there are areas sensitive to the contact of human fingers or other conductive bodies that activate the switches in such a way that the simple contact with those areas causes the opening/closing of the circuits connected to them.

One drawback of the switch devices in the prior art, whether they are electromechanical or electronic, is that they have a limited number of possible functions and, once designed, can no longer be modified.

For example, a switch device configured to house two switching modules, thus corresponding to two functions, can no longer be modified into a device with three power and switching modules or three functions.

Consequently, the manufacturers of such devices must provide for a variety of housing elements, front and external plates, resulting in higher production costs and a greater need for storage space.

Patents IT102018000007451 and IT102018000007149 filed by the same applicant concern switch devices comprising a box-shaped body intended to be fixed to a flush-mounted box, said body being equipped at the front with a front plate on which there are touch sensors or contacts in general, in turn connected to a main electronic control circuit.

In the position opposite to said front plate, that is, on the back of the box-shaped body, there are connectors for the electrical/electronic connection with connection cables to the electrical system of the building and to the equipment that must be controlled by the switch device.

At least one external plate is mounted on said front plate, which may in turn comprise one or more capacitive touch contact areas, each connected to one of said contacts.

Said switches may also comprise one or more lighting devices connected to said main electronic control circuit and mounted in a position behind said external plate, which in turn comprises one or more transparent areas.

SUMMARY OF THE INVENTION

The present invention relates to a new type of switch device with expandable functions and a new accessory to expand the functions, which can be installed on the switch device.

The main object of the present invention is to extend the functions of a switch device without having to structurally modify the switch device itself.

One advantage of the present invention is that it provides a main base module configured in a pre-established and invariable version, and an accessory module which can be selectively connected to said main standard module in order to extend its functions if needed.

The new switch device comprises a main base module, in turn comprising an electronic control circuit and a main box-shaped body intended to be connected directly or indirectly to a flush-mounted box or to a support in general for switching devices.

Said body comprises a front plate on which there are one or more touch sensors or contacts in general, connected to said main electronic control circuit.

Said main module also comprises, preferably in the position opposite to said front plate, that is, on the rear wall of said box-shaped body, connectors for the electrical/electronic connection of cables connecting to the electrical system and to the equipment to be controlled by the main module.

At least one external plate is conveniently mounted on said front plate which in turn may only function as a cover or preferably may be of the type described in patent 102018000007451 or 102018000007149, that is, comprising in turn one or more capacitive touch contact areas.

Said main module may also comprise one or more lighting devices mounted in a position behind said external plate, for example directly or indirectly mounted on said front plate or on said body in general as well as means for selectively turning on/off one or more of said lighting devices. Said lighting devices are, for example, connected to said main electronic circuit.

Said at least one external plate will conveniently comprise one or more transparent areas or in any case suitable to allow the light emitted by said illuminating devices to pass.

Said main module may also comprise one or more remote communication devices, for communication with a remote electronic device, for example a mobile phone in use by a user, which can communicate remotely with said main electronic control circuit and thus control its related functions.

Said main module further comprises at least one electronic connection port, to connect said main electronic circuit to at least one secondary electronic circuit.

Said at least one secondary electronic circuit is preferably housed in a second module, hereinafter called accessory module, in turn comprising a body suited to house said at least one secondary circuit and means for the electronic connection of said at least one secondary circuit to said main electronic command circuit of said main module.

Said main module and said accessory module also comprise means for reciprocal mechanical connection, preferably of the reversible type.

In a preferred embodiment, said main module comprises an opening or seat made on said main body for the insertion of said connection means of the accessory module, which in turn preferably consist of connectors which also provide the electronic connection.

Preferably, said opening is located on the rear side of said body of the main module, that is, on the side opposite said front plate.

Said accessory module may also comprise further connections such as, for example, input connections, output connections, etc.

The installation of the accessory module enables the expansion of the functions of the main module, the main electronic control circuit of which can therefore control not only the functions and equipment connected to said main module, but also the functions and equipment connected to said accessory module.

BRIEF DESCRIPTION OF THE DRAWINGS

The characteristics of the new switch and accessory will be better clarified by the following description with reference to the drawings, attached by way of a non-limiting example.

FIG. 1 shows a schematic side view of the new switch device (100) in a first embodiment, where a main module (1) and an accessory module (2) not connected to the main module (1) are visible.

FIG. 1a shows a schematic front view of the switch device (100) of FIG. 1, while FIG. 1b shows a side view of the switch device (100) where the accessory module (2) is mechanically and electronically connected to the main module (1).

FIG. 2 shows a schematic side view of the new switch device (100') in a second embodiment, where a main module (1) and an accessory module (2') not connected to the main module (1) are visible.

FIG. 2a shows a schematic front view of the switch device (100') of FIG. 2, while FIG. 2b shows a side view of the switch device (100') where the accessory module (2') is mechanically and electronically connected to the main module (1).

DETAILED DESCRIPTION OF EMBODIMENTS OF THE INVENTION

The new switch device (100) comprises a main module (1), in turn comprising a main electronic control circuit, housed in a main box-shaped body (12) intended to be connected directly or indirectly to a flush-mounted box or to a support in general for switches.

Said main body (12) comprises a front plate (11) on which there are touch sensors or contacts in general.

At least one external plate (3) is suitably mounted on said front plate (11) comprising in turn one or more capacitive touch contact areas (31, 32).

Said main module (1) may comprise suitable connections (14) for the electrical/electronic connection with various possible devices which will be controlled by the new switch device.

Said main module (1) also comprises at least one connection port (13) to electronically connect said main electronic control circuit to a second secondary circuit of an accessory module (2).

Said accessory module (2) in turn comprises a housing element (21) of a secondary electronic circuit, means (22) for the electrical/electronic connection of said secondary circuits and/or of said switching modules to said main electronic circuit and means (23) for the mechanical connection of said accessory module (2) to said main body (12) of the main module (1).

For example, said body (12) of said main module (1) suitably comprises at least one opening or seat (13) for the engagement of said mechanical connection means (23) and for the insertion of said electronic connection means (22) of said accessory module (2).

Preferably, said opening (13) is located on the rear side of said box-shaped body (12) of said main module (1), that is, on the side opposite said front plate (11).

Preferably, said mechanical connection means (23) of the accessory module (2) allow the reversible mechanical connection of said accessory module (2) to said main module (1).

The use of said accessory module (2) enables the expansion of the functions of the main module (1) which can therefore control not only the functions connected to it but also the functions connected to the accessory module (2).

In the embodiment shown in FIG. 2, said accessory module (2) may also comprise further connections (24) such as, for example, input connections, output connections, etc.

In both embodiments described above, said accessory module (2) may also comprise devices for remote communication with other electronic devices, for example mobile phones in use by a user, and/or one or more sound emission and/or reception devices, which can be activated remotely or through said connections (24).

Therefore, with reference to the preceding description and the attached drawings the following claims are expressed.

The invention claimed is:

1. A switch device comprising:
    a main module, which comprises,
        a main electronic control circuit,
        one or more direct connections to an electrical system of a building and to equipment or one or more devices to be controlled,
        one or more touch sensors or contacts connected to said main electronic control circuit,
        a main box-shaped body configured to house said main electronic circuit, said one or more connections, and said one or more touch sensors,
        at least one port for a reversible electrical or electronic connection of said main electronic control circuit to a secondary electronic circuit, and
        means for a reversible mechanical connection of a housing element of said secondary electronic circuit; and
    an accessory module, which comprises:
        a housing element for said secondary electronic circuit;
        electric or electronic connection means of said secondary electronic circuit with said main electronic circuit of said main module; and
        mechanical connection means of said housing element of said accessory module to a housing element of said main module,
    wherein said accessory module is configured to provide additional control functions on the electrical system of the building and the equipment or the one or more devices, and
    wherein connecting said main module to said accessory module enables said main module to expand control on said electrical system and said equipment or said one or more devices using the control functions provided by both said main module and said accessory module.

2. The switch device according to claim 1, wherein said main box-shaped body of said main module comprises a front plate, where said one or more touch sensors or contacts are located, and an opening or seat for engagement of said mechanical connection means and for insertion of said electric or electronic connection means of said accessory module, and wherein said opening or seat is located on a rear side of said box-shaped body of said main module, opposite to said front plate.

3. The switch device according to claim 1, wherein said accessory module comprises one or more additional electric or electronic connection means to said equipment or one or more devices to be controlled.

4. The switch device according to claim 1, further comprising one or more sound emitting and/or receiving devices provided in said main module and/or in said accessory module.

5. The switch device according to claim 1, further comprising one or more lighting devices provided in said main module and/or in said accessory module.

6. The switch device according to claim 1, further comprising one or more devices configured for remote communication.

* * * * *